United States Patent [19]

Bell

[11] Patent Number: 5,755,950

[45] Date of Patent: May 26, 1998

[54] PROCESS FOR REMOVING PLATING MATERIALS FROM COPPER-BASED SUBSTRATES

[75] Inventor: Nick J. Bell, Lemont, Ill.

[73] Assignee: Dulin Metals Company, Schiller Park, Ill.

[21] Appl. No.: 799,125

[22] Filed: Feb. 13, 1997

Related U.S. Application Data

[63] Continuation-in-part of Ser. No. 488,627, Jun. 7, 1995, abandoned.

[51] Int. Cl.[6] ................................................ C23F 1/00
[52] U.S. Cl. .......................... 205/445; 205/610; 216/93; 216/106; 216/108
[58] Field of Search .......................... 134/3, 41; 216/93, 216/106, 108; 205/445, 457, 585, 610, 747, 748, 750

[56] References Cited

U.S. PATENT DOCUMENTS

| | | | |
|---|---|---|---|
| 4,325,792 | 4/1982 | Vaughan | 204/520 |
| 4,439,293 | 3/1984 | Vaughan | 205/99 |
| 4,636,288 | 1/1987 | Vaughan | 204/520 |
| 4,652,351 | 3/1987 | Vaughan | 205/560 |
| 4,684,453 | 8/1987 | Vaughan | 204/541 |
| 4,687,545 | 8/1987 | Williams et al. | 216/107 |
| 4,919,752 | 4/1990 | Mika | 216/108 |
| 4,944,851 | 7/1990 | Cordani et al. | 205/575 |

*Primary Examiner*—Bruce F. Bell
*Assistant Examiner*—William T. Leader
*Attorney, Agent, or Firm*—Fitch, Even, Tabin & Flannery

[57] ABSTRACT

An improved method for stripping or removing tin or tin/lead plating materials from copper-based alloys is provided. This method is essentially a two-stage process whereby the bulk of the plating layer is removed in the first stage and the remaining intermetallic layer (i.e., the interface between the copper-based substrate and the plating materials) is removed in the second stage. The first stage uses an aqueous etchant solution containing either sulfuric acid and nitric or an alkane sulfonic acid and nitric acid. An aqueous immersion solution containing either sulfuric acid and copper (II) ions or an alkane sulfonic acid and copper (II) ions (which can form complexes with the alkane sulfonic acid such as copper mesylate) is used in the second stage to remove the remaining intermetallic layer. The copper-based substrate, after rinsing with water and is drying (if appropriate), can then be treated using conventional metal-recycling procedures. If desired, tin or tin/lead (as well as other components) can be recovered from the aqueous etchant and immersion solutions and, if desired, recycled. Recovered sulfonic acid (either sulfuric acid or alkane sulfonic acids) from the aqueous etchant and immersion solutions can also be recycled in the process.

29 Claims, 3 Drawing Sheets

| CATHODE REACTIONS | ANODE REACTIONS |
|---|---|
| $H_2O + e^- \rightarrow OH^- + 1/2\ H_2$ | $H_2O \rightarrow 2H^+ + 1/2\ O_2 + 2e^-$ |
| $NH_4^+ + OH^- \rightarrow NH_3 + H_2O$ | $2\ MSA^- + 2\ H^+ \rightarrow 2\ HMSA$ |

PROCESS FOR REMOVING PLATING MATERIALS FROM COPPER-BASED SUBSTRATES

RELATED APPLICATIONS

This application is a continuation-in-part of U.S. Pat. application Ser. No. 08/488,627, which was filed on Jun. 7, 1995, now abandoned.

FIELD OF THE INVENTION

This invention provides an improved method for the removal of plating materials from copper-based substrates and/or alloys. Removal of the plating materials generally allows the recycling of the copper-based substrate and/or alloy without significant contamination from the plating materials. The improved process of this invention also allows for recovery of the plating materials and regeneration of the various deplating solutions. The improved process of this invention allows for maximum recovery of the copper-based substrates and/or alloys and plating materials with minimal cross contamination and significantly reduced environmental impacts and costs.

BACKGROUND OF THE INVENTION

Tin, tin/lead, or other metallic layers (i.e., plating layers) are often used on various copper-based substrates (such as, for example, printed circuit boards, electrical connector pins for automobile harnesses, electrical components and/or scrap, and the like) for both decorative and functional reasons. Such layers can be deposited by various electroplating, immersion, soldering, or like techniques. It is generally desirable, and often necessary, to remove the plating layers before the substrates can be effectively recycled or reused.

Aqueous solutions designed to strip tin and tin/lead coatings from copper-based substrates are known. For example, aqueous solutions containing hydrogen peroxide and hydrofluoric acid or fluorides have been used. See, for example, U.S. Pat. Nos. 3,926,699, 3,990,982, 4,297,257, 4,306,933, 4,374,744, and 4,673,521. Nitroaromatic compounds have also been used, often in combination with inorganic or organic acids. See, for example, U.S. Pat. Nos. 3,677,949, 4,004,956, 4,397,753, and 4,439,338. Alkane sulfonic acids, usually combined with an inorganic nitrate (e.g., ferric nitrate), have been used as well. See, for example, U.S. Pat. Nos. 4,944,851, 4,957,653, and 5,017,267. None of these methods provide a deplating method which is fully satisfactory. In many cases, the copper-based substrate undergoes significant, and undesirable, dissolution into the deplating solution. None of the just-listed deplating methods provides an integrated, closed loop system whereby the copper-based substrate can be deplated without significant erosion of the underlying base material while providing significant recycling of the various deplating solution, substrates, and deplating materials.

It would be desirable, therefore, to provide a deplating system whereby tin, tin/lead, and/or similar plated copper-based substrates can be deplated without significant erosion or dissolution of the copper substrate. It would also be desirable, to provide an integrated, closed loop deplating system whereby tin, tin/lead, and/or similar plated copper-based substrates can be deplated without significant erosion or dissolution of the copper substrate. It would also be desirable in such an integrated, closed loop system to provide means for regenerating and recycling the various deplating solutions and to provide means for recovering the various deplated materials. The present invention provides such deplating systems.

SUMMARY OF THE INVENTION

The present invention relates to an improved method for stripping or removing tin or tin/lead plating materials from copper-based alloys. The present method is essentially a two-stage process whereby the bulk of the plating layer is removed in the first stage and the remaining intermetallic layer (i.e., the interface between the copper-based substrate and the plating materials) is removed in the second stage. The first stage uses an aqueous etchant solution containing either sulfuric acid and nitric acid or an alkane sulfonic acid and nitric acid. An aqueous immersion solution containing either sulfuric acid and copper (II) ions or an alkane sulfonic acid and copper (II) ions (which can form salts or complexes with the sulfonic acid such as copper sulfate or copper mesylate) is used in the second stage to remove the remaining plating materials from the intermetallic layer. The copper-based substrate, after rinsing and drying (if appropriate), can then be treated using conventional metal-recycling procedures. If desired, tin or tin/lead (as well as other components) can be recovered from the aqueous etchant and immersion solutions and, if desired, recycled. Recovered sulfuric acid or alkane sulfonic acid from the aqueous etchant and immersion solutions can also be recycled in the process.

One object of the present invention is to provide a method for removing plating materials from a plated substrate comprising a copper-based alloy with a tin-based or tin/lead-based surface plated layer, said method comprising:

(1) treating the plated substrate at a temperature of about 50° to 150° F. with an aqueous etchant solution containing about 1 to 50 weight percent of sulfuric acid or a first sulfonic acid and about 0.1 to 5 weight percent nitric acid, whereby the surface plated layer metals are removed by, and dissolved or suspended in, the aqueous etchant solution and an intermetallic layer containing tin or tin/lead remains on the treated surface;

(2) separating the treated substrate and the aqueous etchant solution;

(3) rinsing the separated substrate from step (2) with water;

(4) treating the rinsed substrate of step (3) at a temperature of about 70° to 210° F. with an aqueous immersion solution containing about 1 to 50 weight percent of sulfuric acid or a second sulfonic acid and about 1 to 150 g/l of copper cation in the form of a copper (II) salt, whereby the tin or tin/lead in the intermetallic layer are removed from the substrate and the substrate is rendered essentially free of tin or tin/lead from the surface plated layer; and (5) separating the substrate from step (4) from the aqueous immersion solution, wherein the substrate is essentially free of surface plated tin or tin/lead.

Another object of the present invention is to provide an integrated process for removing plating materials from a plated substrate comprising a copper-based alloy with a tin-based or tin/lead-based surface plated layer, said integrated process comprising:

(1) treating the plated substrate at a temperature of about 50° to 150° F. with an aqueous etchant solution containing about 1 to 50 weight percent of sulfuric acid or a first sulfonic acid and about 0.1 to 5 weight percent nitric acid, whereby the surface plated layer metals are removed by, and dissolved in, the aqueous etchant solution and an intermetallic layer containing tin or tin/lead remains on the treated surface;

(2) separating the treated substrate and the aqueous etchant solution;

(3) rinsing the separated substrate from step (2) with water;

(4) treating the rinsed substrate of step (3) at a temperature of about 70° to 210° F. with an aqueous immersion solution containing about 1 to 50 weight percent of sulfuric acid or a second sulfonic acid and about 1 to 150 g/l of copper cation in the form of a copper (II) salt, whereby the tin or tin/lead in the intermetallic layer are removed from the substrate and the substrate is rendered essentially free of tin or tin/lead from the surface plated layer; and (5) separating the substrate from step (4) from the aqueous immersion solution, wherein the substrate is essentially free of surface plated tin or tin/lead;

wherein the recovered aqueous etchant solution of step (2) and the recovered aqueous immersion solution from step (5) are separately treated to recover at least a portion of the tin or tin/lead contained therein and to regenerate aqueous etchant solution or aqueous immersion solution.

For purposes of this invention, the term "sulfonic acid" includes sulfuric acid and alkane sulfonic acids. Generally, sulfuric acid is the preferred sulfonic acid for both the aqueous etchant solution and the aqueous immersion solution when deplating tin-coated metals. When solder-plated (e.g., tin/lead-coated) metals are deplated, however, an alkane sulfonic acid is preferred as the sulfonic acid in both the etchant and immersion solutions.

These and other objects and advantages of the present invention will become apparent through the following description of the drawings and preferred embodiments of the invention.

DETAILED DESCRIPTION OF THE INVENTION

The method of the present invention provides an improved method for the removal of tin-based or tin/lead-based plating from copper-based substrates. This process is designed to remove various plating materials (especially tin-based and tin/lead-based plating materials) from copper and copper alloy substrates. Removal of the plating materials allows the base materials or substrates to be recycled with significantly less contamination from the plating metals. In one preferred embodiment of this invention, in addition to recovery of the copper-based substrate, up to about 95 percent of the plating metals can also be recovered in metallic form for recycling through remelting and/or smelting. Still more of the plating materials can, if desired, be recovered as oxides and/or hydroxides. The present recovery system can be operated in a "closed loop" so as to minimize the amount of by-products for disposal, thereby minimizing environmental impacts.

The present deplating process consists essentially of two stages. In the first stage, the plated copper-based substrate is exposed to an aqueous etchant solution containing sulfuric acid or an alkane sulfonic acid and nitric acid at a temperature of about 50° to 150° F. for a time sufficient to remove the majority or bulk of the plating material or layer. Both the temperature and the content of the etchant solution are controlled to prevent significant removal of copper from the base substrate itself. After removing the majority or bulk of the plating material or layer, the treated substrate is preferably rinsed with water to remove excess etchant solution. After treatment with the etchant solution, an intermetallic layer (consisting mainly of Sn/Cu and/or Sn/Zn/Cu alloyed layers) remains on the copper-based substrate. The intermetallic layer is then removed in a second stage by treatment with an aqueous immersion solution containing sulfuric acid or an alkane sulfonic acid and copper (II) salts or complexes. Once the intermetallic layer has been removed, the stripped copper-based substrate can be rinsed to remove excess immersion solution and then recycled or recovered using conventional techniques.

Figure 1:
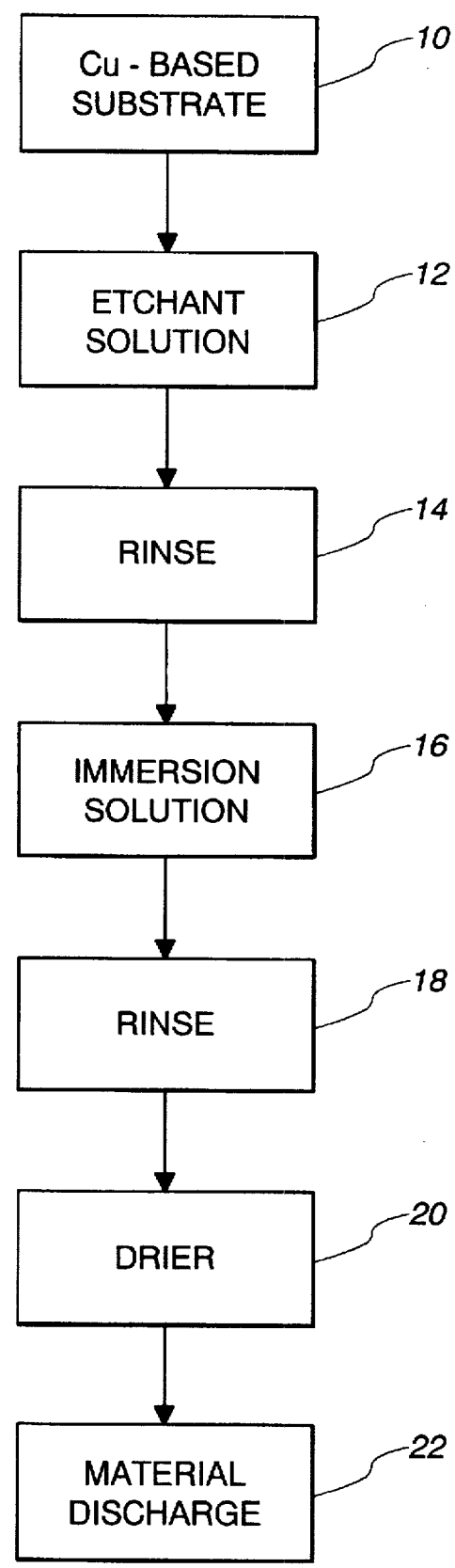
FIG. 1 is a flowchart illustrating the basic process of this invention.

FIG. 1 illustrates, in simplified form, the process of this invention. Copper-based substrate 10 is treated with an etchant solution 12 to remove the majority of the plating layers. The material is then rinsed with water 14, preferably hot water, and then treated with an immersion solution 16 to remove the plating material from the intermetallic layers. After rinsing 18, and the optional drying step 20, the copper-based substrate 22 is discharged in a form suitable for recycling without significant contamination from the plating materials. As is evident, plating metals are removed in the etch step 12 and the immersion treatment step 16. By removing the plating metals in two stages, better control of the process is obtained thereby preventing excessive removal or dissolution of the base metals from the substrate while effectively removing the plating metals in the plating layer or layers.

Although not wishing to be limited by theory (and using methane sulfonic acid (HMSA) as the active etchant), it appears that one or more of the following reactions takes place during the etchant treatment:

$$HNO_3 + 4Sn + 8HMSA \rightarrow NH_4MSA + 4Sn(MSA)_2 + 3H_2O \quad (1)$$

$$HNO_3 + 3Sn + 6HMSA \rightarrow H_2NOH + 3Sn(MSA)_2 + 2H_2O \quad (2)$$

$$2HNO_3 + 5Sn + 10HMSA \rightarrow N_2 + 5Sn(MSA)_2 + 6H_2O \quad (3)$$

At least 50 percent of the nitric acid in the etchant appears to be reduced to $NH_4^+$ (and ultimately to $NH_3$); thus it appears that Eq. (1) predominates. Currently, there is no direct evidence for the occurrence of Eqs. (2) and (3); but, of these two, it seems more likely that Eq. (3) occurs in the present etchant process. Free acid is required in the etchant to allow large amounts of tin to be dissolved during the etchant process. Both ammonium and tin salts of methane sulfonic acid are generated during the etching process (as suggested by Eq. (1)). Free acid can be regenerated by plating out the tin in an electrowinning cell (e.g., plate out cell 26 in FIG. 2):

Cathode reaction:

$$Sn(MSA)_2 + 2e^- \rightarrow Sn(metal) + 2MSA^-$$

Anode reaction:

$$H_2O \rightarrow 2H^+ + \tfrac{1}{2}O_2 + 2e^-$$

overall reaction:

$$Sn(MSA)_2 + H_2O \rightarrow Sn(metal) + 2HMSA + \tfrac{1}{2}O_2.$$

Free acid can also be generated from the ammonium salts by conversion of $NH_4^+$ to $NH_3$ (as described in detail below in regard to ammonia separator 32 in FIGS. 2 and 3). Similar reactions are expected to occur when the active etchant is sulfuric acid or other alkane sulfonic acids.

Figure 2:
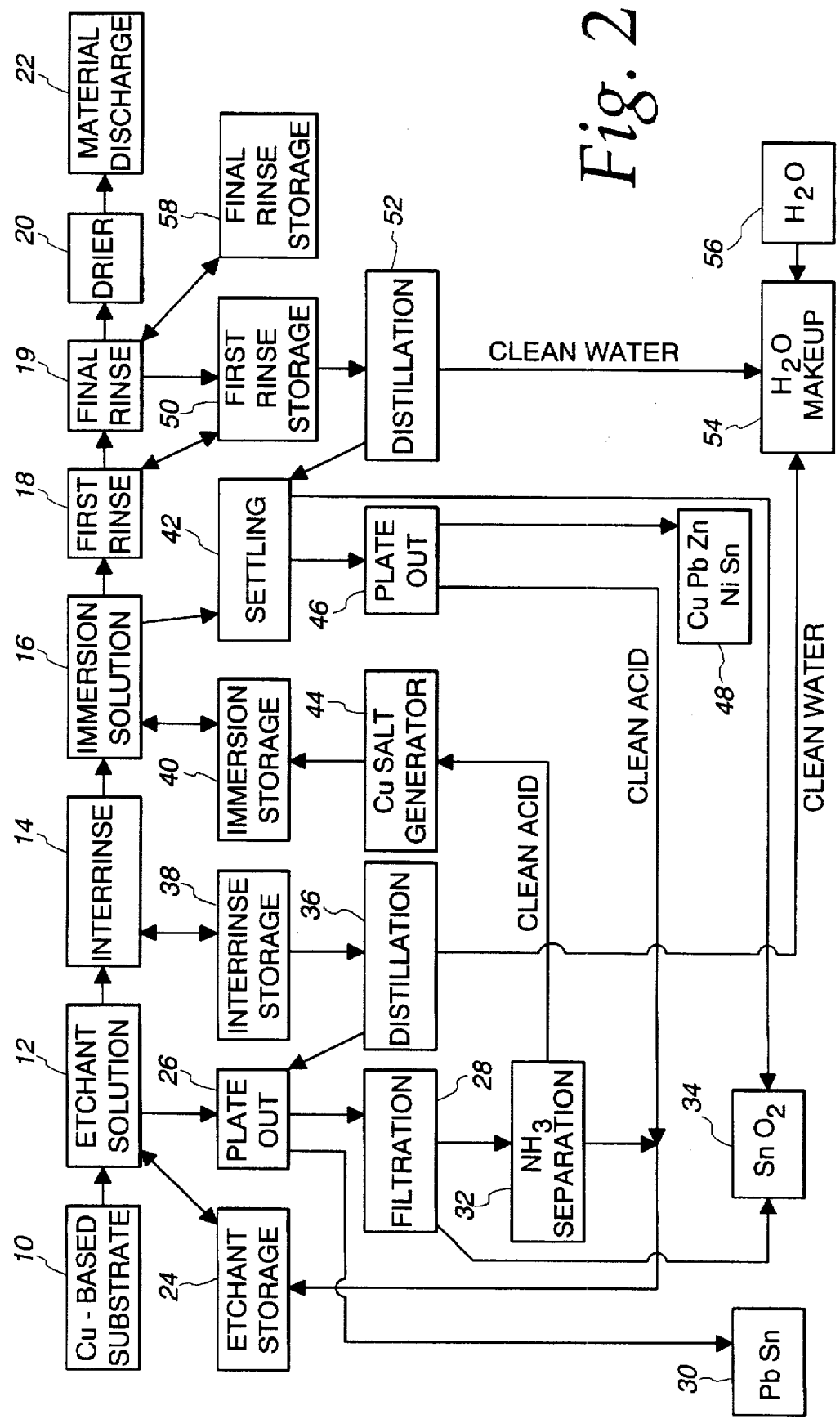
FIG. 2 is a flowchart illustrating a preferred, integrated process for the practice of this invention.

FIG. 2 illustrates an especially preferred integrated process for the present deplating system. This integrated process is designed to allow extensive recycling of the reactants and by-products, thereby minimizing environmental impacts and costs. This integrated process can easily be scaled up to handle 10,000 to 20,000 pounds of scrap material or other substrate per cycle. Of course, deplating circuits can be designed for smaller or larger capacities. In FIG. 2, heavy arrows indicate the process flow of the copper-based substrate 10 and lighter arrows indicate the process flow of reactants, processing streams, and by-products. The copper-based substrate 10 is treated with the etchant solution 12 for removal of the majority of the plating layers. Preferably, such etchant treatment is carried out in a large tumbler or other container having a mixing or tumbling action. Etchant solution is stored in etchant storage container 24 for reuse or recycling. After removal of the etchant to storage container 24, the treated copper-based substrate is then rinsed with water, preferably hot water, in inter-rinse step 14 before being treated with immersion solution 16 (preferably in the same tumbler or container as used for the etchant treatment step) where the plating metals from the intermetallic plating layers are removed. The inter-rinse solution 14 is stored in inter-rinse storage 38. Of course, additional rinsing steps or cycles can be used between the etchant solution 12 and the immersion solution 16 if desired. The immersion solution is stored in immersion storage 40 for reuse or recycling.

After removal of the intermetallic layers in 16 and removal of the immersion solution to immersion storage 40, the treated copper-based substrate is rinsed with water to remove immersion solution remaining with the substrate. Preferably, the rinsing step is carried out with at least two rinses—first rinse 18 and final rinse 19. Of course, fewer or more rinsing steps can be included if desired. The first rinse solution is stored in first rinse storage 50; the final rinse is stored in final storage 58. If desired, an abrasive powder (i.e., alumina, silica, or the like) can be used to polish the parts and thereby obtain a yellow brass finish on the recovered parts. Such an abrasive powder, generally at about 0.5 to 5 weight percent based on the total weight of the parts, is tumbled with the parts in, or after, the final rinse. Generally powder sizes of about 5 to 240 microns are suitable for polishing; preferably the particle size is in the range of about 20 to 80 microns. Abrasive processing (not shown in FIG. 2) generally requires about 0.5 to 1 hour in a tumbler device; the abrasive can be recycled if desired. Abrasive polishing generally removes less than about 0.2 weight percent of the metal (i.e., about 5 to 10 microinches from a surface); the amount removed will, of course, depend on the duration of the polish step as well as other factors. Preferably, and especially when abrasive polishing is used, the pH of the residual liquids left on the copper parts are the final rinse is adjusted to about 8 to 10 since copper alloys generally passivate in this pH range. After rinsing (and abrasive processing if used), the treated copper-based substrate, now with the intermetallic layers removed, can be dried, if desired, in drier 20 (preferably a tumbler drier) and then discharged at step 22. If desired, an absorbant (e.g., dry corn cob) can be used in drier 20; the absorbant material can be dried and reused if desired. Preferably the product metal pieces are discharged onto a vibratory table or bed so that finer particles (including the abrasive powder and absorbant if used) can be separated from the metal pieces. The discharged material 22 can then be reused or recycled, as appropriate, without significant contamination from the plating layers or materials. Although more than one unit can be used in the present process, it is generally preferred that all treatment steps (i.e., etchant treatment and immersion treatment steps) and all rinse steps be carried out in a single container (preferably a large tumbler) by pumping and draining the appropriate solutions into and out of the container at the appropriate times.

The etchant solution 12 and the immersion solution 16 can be used repeatedly for different batches (usually up to about 12 to 35 batches depending on the thickness and composition of the plating layers) of copper-based substrates. These solutions (as well as the various rinse solutions 14, 18, and 19) will, however, become loaded with removed plating materials and other contaminants which will significantly reduce their removal effectiveness. These exhausted solutions can, of course, be replaced with fresh etchant and immersion solutions. Preferably, however, the etchant and immersion solutions are separately treated to remove plating metals contained therein and to regenerate the etchant and/or immersion solutions.

The etchant solution, once contaminated with removed plating materials and ammonia at levels to render the solution inefficient, is diverted to a first plate-out cell 26 from etchant solution 12 (or from etchant storage 24; process line is not shown). The removed metals (mainly Sn and Pb) are plated out of the etchant solution using conventional electrowinning techniques and are removed, preferably for recycling, at step 30. Approximately 25 percent of the tin from the etchant solution will precipitate as tin oxides during the electrowinning process. It appears that the yield of metallic tin in the plate-out unit 26 can be maximized by heating the solution to an elevated temperature (i.e., about 150° to 190° F.) and then treating the solution in the plate out cell 26 at a temperature of about 55° to 140° F. (preferably about 75° to 125° F.). It also appears that the yield of metallic tin can also be increased, if desired, by carrying out the electrowinning in plate-out cell 26 using an anion permeable membrane between the cathode and anode.

The solution from the plate-out cell 26 is then filtered to remove the tin oxides (mainly $SnO_2$) 34 and then treated in an electrolysis cell 32 to remove excess ammonia and generate clean sulfonic acid. Once excess ammonia is removed, the solution (containing clean sulfonic acid) can then be used to prepare either additional etchant solution 24 or additional immersion solution 40 (via copper salt generator 44).

The immersion solution 40, once contaminated with plating materials (i.e., residual metals), is allow to settle. If desired, the immersion solution can be diverted to settling tank 42 where solids (mainly tin oxides) are allowed to settle out. Of course, other means such as, for example, filtration, can also be used to remove such solids. The settled tin oxide is collected (along with material from filtration unit 28) at unit 34 for recycling. The solution from settling tank 42 is then removed to the second plate-out cell 46 for removal of trace elements (i.e., Cu, Sn, Pb, Zn, Ni, and the like depending on the composition of the plating materials and substrate) using conventional electrowinning techniques. (If copper-based substrates containing significant levels of beryllium are treated by the present method, it will generally be preferred to include an optional phase extraction unit using, for example, kerosene extraction (not shown) after the settling tank 42 and before the plate out cell 46 to remove beryllium. Such beryllium could then be recovered.) The recovered trace elements are collected at unit 48 for, if desired, recycling.

As noted above, the clean sulfonic acid output from the ammonium separator 32 can be used to generate etchant solution 24 or immersion solution 40. Clean sulfonic acid output from plate out unit 46 can also be used to generate etchant solution 24 or immersion solution 40. To generate immersion solution 40, the clean sulfonic acid output from ammonia separator 32 and/or plate out unit 46 is diverted to copper salt generator 44. If the acid is methane sulfonic acid, copper (II) mesylate is generated in copper salt generator 44.

As noted above, the various rinse solutions (nos. 14, 19, and 20) will also pick up or carry over reactants and by-products from the etchant solution 12 and the immersion solution 16. To minimize such carry over, it is generally preferred that the treated substrate is well drained between each treatment and rinse step to minimize carry over into the next step. Eventually after a number of cycles, however, the rinse solutions will become contaminated with the etchant and immersion solutions and removed plating materials and lose their effectiveness. Preferably, such spent rinse solutions are then treated to recover the reactants, metals, and water. Thus, the inter-rinse solution 14 from storage 38 can be treated by distillation, preferably vacuum distillation, to remove and recover clean water which can then be transferred to the water make-up unit 54. The residues (containing etching materials and metals) can be treated in the first plate-out unit 26 along with the spent etchant solution. Spent first rinse solution 50 and spent final rinse solution 58 can be treated in a similar distillation unit 52, preferably by vacuum distillation, to remove and recover clean water which is also transferred to the water make-up unit 54. Residues (containing immersion etching materials and metals) can then be treated in the settling tank 42 and then in the second plate-out unit 46. Recovered clean water in the water make-up unit 54 (along with any required additional water from water source 56) can then be recycled in the system. For example, such water could be used to generate etchant solution 24, immersion solution 40, and/or any of the rinse solutions 38, 50, and 58 (process lines not shown).

Using the integrated process shown in FIG. 2, the plating layers can be removed from the substrate in an efficient and effective manner while minimizing environmental impacts and costs. The treated substrate is suitable for recycling without significant contamination from the plating materials. Moreover, the plating materials themselves are recovered. Although the recovered plating materials are preferably recycled or reused, they can also be, if appropriate, disposed of in an environmentally sound manner. Reactants, especially the sulfonic acids, can be recovered and reused in the process. Process water is also recovered and reused, thereby minimizing discharges to the environment.

Fresh etchant solution 12 generally contains about 1 to about 50 weight percent of a sulfonic acid and about 0.1 to about 5 weight percent nitric acid. Preferably, fresh etchant solution 12 generally contains about 20 to about 30 weight percent of a sulfonic acid and about 1 to about 3 weight percent nitric acid. Suitable sulfonic acids include alkane sulfonic acids of the formula $RSO_3H$ where R is a lower alkyl group or a fluorinated lower alkyl group having 1 to 5 carbons. Examples of such alkane sulfonic acids include, for example, methane sulfonic acid, ethane sulfonic acid, trifluoromethane sulfonic acid, propane sulfonic acid, butane sulfonic acid, pentane sulfonic acid, and the like. Preferably the R group in the alkane sulfonic acid contains 1 or 2 carbon atoms. Alternatively, sulfuric acid may be used in the etchant. When deplating tin-coated substrates, the preferred acid is sulfuric acid. When deplating tin/lead (i.e., solder)-coated substrates, the preferred sulfonic acids are alkane sulfonic acids with methane sulfonic acid being the most preferred. To prevent excessive removal of copper from the copper-based substrate, the nitric acid concentration in the etchant solution should be kept below about 5 weight percent and preferably below about 4 weight percent. More preferably, the fresh etchant solution contains about 15 to about 25 weight percent sulfonic acid and about 1 to about 1.5 weight percent nitric acid; most preferably, the fresh etchant solution contains about 20 weight percent sulfonic acid and about 1 weight percent nitric acid. Generally, commercially available nitric acid (about 70 percent concentration) is used; other grades of nitric acid can, of course, be used if desired.

Generally the temperature of the etchant solution in etchant unit 12 is between about 50° to about 150° F. and preferably from about room temperature to about 140° F. With an etchant solution containing about 20 weight percent methane sulfonic acid and about 1 weight percent nitric acid, the tin or tin/lead plating layer will be removed at about 100 microinches/minute at a temperature of about 70° F. Etchant temperatures in excess of about 160° F. should be avoided since they appear to promote the formation of $HNO_2$ which can aggressively attack the copper substrate, thereby removing excessive amount of copper from the base material.

The inter-rinse 14 is preferably carried out at an elevated temperature to assist in maintaining a high temperature for the substrate entering the immersion treatment unit 16. Preferably the inter-rinse is at a temperature greater than about 160° and more preferably at a temperature greater than about 190° F.

Fresh immersion solution 16 generally contains about 1 to about 50 weight percent of a sulfonic acid and about 1 to about 150 g/l of $Cu^{+2}$ in the form of a soluble copper (II) salt. The same sulfonic acids used in the etchant solution are used in the immersion solution. Preferably the same sulfonic acid is used in both the etchant solution and the immersion solution. Thus, when deplating tin-coated substrates, the preferred acid for the immersion solution is sulfuric acid; and when deplateing tin/lead (i.e., solder) -coated substrates, the preferred sulfonic acids are alkane sulfonic acids with methane sulfonic acid being the most preferred. The copper cations can be supplied by simply adding water-soluble copper (II) salts or by generation of copper (II) salts in an electrolytic cell. Suitable water-soluble copper (II) salts include copper(II) mesylate, copper (II) sulfate, copper (II) acetate, copper (II) chloride, and the like. As one skilled in the art will realize, use of added copper (II) salts will lead to a build up of the counterions (e.g., sulfate, acetate, or chloride ions). Preferably, therefore, the copper (II) cations are generated electrolytically from a sulfonic acid solution (as detailed below). Most preferably, the immersion solution is generated from spent etchant, after ammonia removal, or from spent immersion solution after the metals are plated out.

Preferably, fresh immersion solution 16 contains about 20 to about 30 weight percent of the sulfonic acid and about 5 to 100 g/l of the copper (II) cation. More preferably, fresh immersion solution 16 contains about 20 to about 30 weight percent of the sulfonic acid and about 20 to 60 g/l of the copper (II) cation. Generally the amount of copper in the immersion solution is sufficient to provide copper (II) ions to complex with most, but not all, of the sulfonic acid present. Preferably, about 1 to 20 percent, and most preferably about 3 to 10 percent, of the sulfonic acid is present as free acid in the fresh immersion solution. Most preferably, there is sufficient free acid present to maintain a pH of less than about 4, and even more preferably a pH of less than about 2. Preferably the alkane sulfonic acid is methane sulfonic acid such that the copper (II) cation is present as copper (II) mesylate.

The immersion treatment is generally carried out at a temperature of about 100° up to the boiling point of the solution. Preferably the temperature of the immersion treatment is about 150° to about 190° F. Depending on the effectiveness of the etchant solution and the thickness of the intermetallic layer remaining on the substrate entering the immersion solution unit 16, it is generally expected that the immersion solution can be used for up to about 10 to 35 cycles before it is necessary to regenerate the immersion solution.

Preferably both the etchant and the immersion solutions are treated to recover the metals contained therein as well as the sulfonic acid. Preferably the etchant solution 24 and the immersion solution 40 are treated by conventional electrolysis or electrowinning techniques to recover the metal values (mainly tin and lead in the first plate-out cell 26 and copper, tin, lead, zinc, nickel, and other trace metals in the second plate-out cell 46). Both the first and second plate-out cells 26 and 46 are generally operated at a nominal current density of about 0.5 to 2.5 kiloamps/m$^2$ and preferably about 1 to 1.25 kiloamps/m$^2$ and a temperature of about 50° to 140° F. and preferably about 70° to 120° F. Inert oxygen evolving anodes are preferred.

During the etchant treatment and metal recovery step 26, at least a portion of the nitric acid is reduced to ammonia and nitrogen gas. Generally it has been found that the etchant solution remains effective until the ammonia concentration reaches a level of about 1.5N. Normally, about 12 to 35 cycles of etching and metal removal can be achieved before the ammonia levels reach this level. Recovery of free sulfonic acid from the spent etchant is achieved by preferably removing ammonia from the solution from the plate-out cell 26 and filtration 28 using ammonia separation unit 32. Preferably ammonia separation unit 32 is a two- or three-compartment electrolysis cell. A suitable three-compartment electrolysis cell for ammonia removal is shown in FIG. 3. Using such a cell, ammonia can be removed from the etchant solution and the sulfonic acid regenerated. The electrolysis cell consists of a cathode 80, anode 86, and membranes 82 and 84. The membranes 82 and 84 separate the cell into three compartments: catholyte surrounding the cathode, anolyte surrounding the anode, and the central portion between the two membranes.

Using methane sulfonic acid (HMSA) as an illustrative sulfonic acid, spent etchant 88 (i.e., NH$_4$MSA where HMSA is methane sulfonic acid) from the filtration unit 28 is fed into the central portion of the cell. Membrane 82 is a cation exchange membrane which allows NH$_4^+$ ions 90 to pass into the catholyte; membrane 84 is a anion exchange membrane which allows MSA$^-$ ions 92 to pass into the anolyte. Cathode 80 is preferably an inert metal such as titanium, copper, stainless steel, and the like. Anode 86 is preferably iridium oxide, platinum, stainless steel, and the like; more preferably anode 86 has a precious metal oxide coating to promote current flow at low voltage. Current densities in the ammonia removal cell range from about 1 to about 2.5 kiloamps/m$^2$; and temperature is generally maintained between about 55° to about 190° F., and preferably between about 70° to about 140° F. In operation, the spent etchant 88 (i.e., NH$_4$MSA-containing stream) is fed into the central portion of the cell. Although not wishing to be limited by theory, it appears that NH$_4^+$ ions migrate from the central portion through membrane 82 to the cathode 80 where they combine with OH$^-$ formed at the cathode 80 to form ammonia 94 which escapes from the cell. Air or inert gas sparging of the catholyte can be, if desired, used to assist ammonia removal. Simultaneously, MSA$^-$ ions migrate from the central portion through membrane 84 to the anode 86 where they accept H$^+$ ions and form HMSA (i.e., free methane sulfonic acid). Thus, the following reactions appear to occur at the cathode and anode:

Cathode Reactions

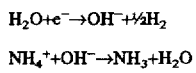

$$NH_4^+ + OH^- \rightarrow NH_3 + H_2O$$

Anode Reactions

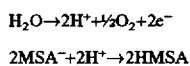

$$2MSA^- + 2H^+ \rightarrow 2HMSA$$

The regenerated HMSA is removed from the anolyte to prepare additional etchant solution 24 and/or additional immersion solution 40.

Figure 3:
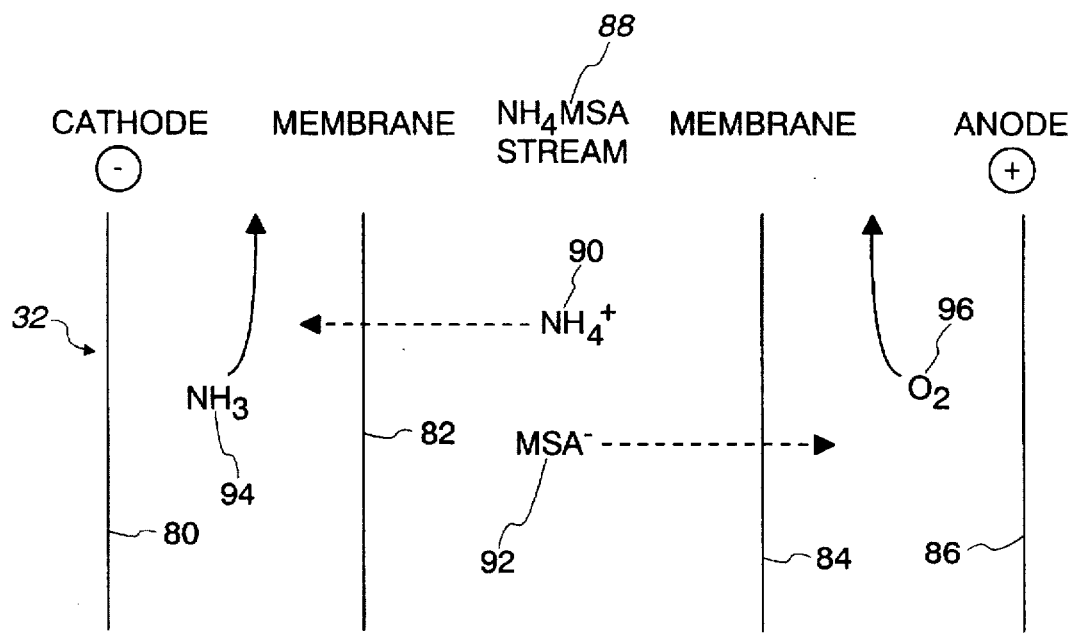
FIG. 3 is a schematic of an ammonia recovery cell suitable for use in the present invention.

Preferably the cell in FIG. 3 is configured for flow through operation with the catholyte volume being relatively small, feed volume large, and anolyte having a specific gravity sensor for monitoring HMSA production. Generally, anolyte having about 20 to 30 weight percent acid is suitable for use in generating etchant solution 24 and/or immersion solution 40. Preferably, a production cell consists of 11 pairs of monopolar electrodes and complementary sets of anion and cation exchange membranes to provide 10 cells (as shown in FIG. 3) each having about 4 square feet of membrane surface area. Of course, fewer or more cells and larger or smaller membrane surface areas can be used. For membranes operating at a current density of about 2 kiloamps/m$^2$, such a production cell will have a total current of about 7.5 kiloamps. For such a production cell, ammonia removal and acid separation will generally be effected in about 18 hours for about 2200 liters of spent etchant. The ammonia removal cell 32 can be operated in batch, continuous, or semi-continuous modes.

Free sulfonic acid generated from the ammonia removal cell 32 can be used directly to generate etchant solution 24. In order to generate immersion solution 40, copper salts must be added to the free sulfonic acid or, more preferably, generated with an electrolysis cell using a soluble copper anode in the free acid solution. Thus, regeneration of immersion solution, once the free sulfonic acid is generated, is essentially the same as preparation of fresh immersion solution 40. Preferably a two-compartment electrolysis cell having a cation specific membrane (e.g., Nafion membrane from DuPont) that allows H$^+$ ions to pass but substantially prevents passage of Cu$^{+2}$ ions is used. Preferably copper in an inert metal basket serves as the anode; inert metals such as titanium, copper, stainless steel, and the like can serve as the cathode. Preferably, a production cell for generation of immersion solution 40 consists of 11 pairs of monopolar electrodes and complementary cation exchange membrane to provide 10 cells each having about 4 square feet of membrane surface area. Of course, fewer or more cells and larger or smaller membrane surface areas can be used. For such a production cell operating at about 2 kiloamps/m$^2$, generation of immersion solution (i.e., copper (II) mesylate) will generally be effected in about 8 hours for about 2000 liters of methane sulfonic acid from the ammonia separator 32. The production cell can be operated in a batch, continuous, or semi-continuous mode. Such a production cell can, of course, be used in a similar manner to generate the initial batch of immersion solution.

The following examples are intended to further illustrate the invention and not to limit it.

EXAMPLE 1

Skeletal scrap from an electronic connector manufacturer was treated by the process of this invention. The scrap was alloy 260 brass with a copper flash underplate and 3.5 weight percent tin/lead plating. Individual scrap parts were about 0.5×0.75×0.009 inches and weighted about 0.2 g. Loose scrap (30 pounds) was introduced into a 20-inch diameter cylindrical mixer having two internal helical vanes. Agitation was provided by rotating the mixer at about 2 rpm.

Recycled etchant was used. This etchant had been cycled from the etching stage to plate out stage about 19 times. The etchant contained about 15 weight percent methane sulfonic acid and about 1 weight percent nitric acid. Three gallons of the etchant was introduced into the charged mixer at about 90° F. The mixture was agitated for about 5 minutes by which time the tin/lead plating had been removed down to the intermetallic layer. The etchant was drained off and saved for recovery (i.e., electrowinning). Hot water (about 3.5 gallons) at about 190° F. was added to the mixer; agitation was continued for about 5 minutes and the rinse water drained off. Temperature had decreased to about 130° F. during the rinse.

Immersion solution (about 3 gallons) at about 190° F. was added and agitated for about total time of 15 minutes. The immersion solution contained about 5 weight percent methane sulfonic acid and the copper (II) mesylate added at about 50 g/l copper. The free acid content of the immersion solution was about 5 percent and the pH was below about 2. After about 7–8 minutes, the immersion solution was drained (temperature had fallen to about 140° F.) and then replaced with an additional 3 gallon charge of immersion solution to maintain the temperature above 140° F. Agitation was continued for an additional 7–8 minutes at which time the immersion solution was drained off. The treated scrap was then washed twice with distilled water (about 1 gallon per wash) and dried in the mixer by circulating hot air through the mixer for about 20 minutes.

The dried deplated scrap was then collected. The scrap had a matte salmon pink color with slight oxidation from drying. Metal assay confirmed tin at about 0.003 weight percent and lead at less than 0.001 weight percent. The scrap metal is suitable for recycling without significant contamination from the tin and lead plating materials. Both the etchant and immersion solutions can be used for additional treatment cycles or they could be treated and regenerated to form fresh etchant and/or immersion solutions.

EXAMPLE 2

A batch of tinned 260 grade brass scrap was treated by the process of this invention. The scrap contained about 1.7 weight percent tin, about 0.004 weight percent lead, and about 0.012 weight percent nickel before deplating. The scrap (about 6500 pounds; average size of about 4 cm×4 cm×0.5 mm) was introduced into a 10,000 pound capacity tumbler. Agitation was provided by rotating the tumbler at about 5 rpm.

Recycled etchant was used. This etchant had been recycled from the etching stage three times. The etchant contained about 2.4 molar sulfuric acid and about 1 weight percent nitric acid. About 400 gallons of the etchant was introduced into the charged tumbler at about 60° F. The mixture was agitated for about 7 minutes by which time the tin/lead plating had been removed down to the intermetallic layer. The etchant was drained off and saved for recovery. Hot water (about 400 gallons) at about 170° F. was added to the mixer; agitation was continued for about 10 minutes and the rinse water drained off. Temperature had decreased to about 135° F. during the rinse.

Immersion solution (about 400 gallons) at about 170° F. was added and agitated for about total time of 12 minutes. The immersion solution contained sulfuric acid and copper sulfate at concentrations of about 0.58 molar free acid and 10.0 g/l copper sulfate. The immersion solution was drained (temperature had fallen to about 160° F.). The treated scrap was then washed twice with tap water (about 400 gallon per wash) at about 60° F. with a dwell time of about 10 minutes per wash. Silica sand abrasive (about 40 micron average particle size) was added to the drained scrap at about one weight percent. Polishing was continued for about 90 minutes with agitation. Corn cob grit was added at about 4 weight percent and agitation continued for an additional 15 minutes to remove excess water.

The dried finished parts were separated from the other media and then analyzed. The scrap had a yellowish, brass color. Metal assay confirmed tin at about 0.013 weight percent, lead at less than 0.003 weight percent, and nickel at about 0.002 weight percent. The scrap metal is suitable for recycling without significant contamination from the tin, lead, and nickel plating materials. Both the etchant and immersion solutions can be used for additional treatment cycles or they could be neutralized (using, for example, NaOH or $Ca(OH)_2$) and then discharged in an environmentally acceptable manner or they could be treated and regenerated to form fresh etchant and/or immersion solutions. Preferably, the etchant and immersion solutions are used up to twenty times and then neutralized and discharged.

That which is claimed is:

1. A method for removing plating materials from a plated substrate comprising a copper-based alloy with a tin-based or tin/lead-based surface plated layer, said method comprising:

(1) treating the plated substrate at a temperature of about 50° to 150° F. with an aqueous etchant solution consisting essentially of about 1 to 50 weight percent of an etchant acid and about 0.1 to 5 weight percent nitric acid, the surface plated layer metals being removed by, and dissolved or suspended in, the aqueous etchant solution and an intermetallic layer containing tin or tin/lead remaining on the treated surface;

(2) separating the treated substrate and the aqueous etchant solution;

(3) rinsing the separated substrate from step (2) with water;

(4) treating the rinsed substrate of step (3) at a temperature of about 70° to 210° F. with an aqueous immersion solution consisting essentially of about 1 to 50 weight percent of an immersion acid and about 1 to 150 g/l of copper cation in the form of a copper (II) salt, the tin or tin/lead in the intermetallic layer being removed from the substrate and the substrate being rendered essentially free of tin or tin/lead from the surface plated layer; and (5) separating the substrate from step (4) from the aqueous immersion solution, wherein the substrate is essentially free of surface plated tin or tin/lead;

wherein the etchant acid and the immersion acid are independently selected from the group consisting of sulfuric acid and alkane sulfonic acids.

2. A method as defined in claim 1, wherein the etchant acid and the immersion acid are both the same alkane sulfonic acid.

3. A method as defined in claim 2, wherein the etchant acid and the immersion acid are both methane sulfonic acid, the etchant solution contains about 15 to 25 weight percent methane sulfonic acid and about 1 to 1.5 weight percent nitric acid, and the immersion solution contains 20 to 30 weight percent of methane sulfonic acid and about 20 to 60 g/l of the copper cation.

4. A method as defined in claim 1, wherein the immersion solution contains 20 to 30 weight percent of methane sulfonic acid and about 20 to 60 g/l of the copper cation.

5. A method as defined in claim 1, wherein the etchant acid and the immersion acid are both sulfuric acid.

6. A method as defined in claim 5, wherein the etchant solution contains about 15 to 25 weight percent sulfuric acid and about 1 to 1.5 weight percent nitric acid, and the immersion solution contains 20 to 30 weight percent of sulfuric acid and about 20 to 60 g/l of the copper cation.

7. A method as defined in claim 1, wherein the immersion solution contains 20 to 30 weight percent of sulfuric acid and about 20 to 60 g/l of the copper cation.

8. A method as defined in claim 1, wherein the copper cation in the immersion solution is derived from the addition of a water-soluble copper (II) salt.

9. A method as defined in claim 1, wherein the copper cation in the immersion solution is derived from the electrolysis of a sulfonic acid solution using a soluble copper electrode.

10. A method as defined in claim 1, wherein the immersion acid is alkane sulfonic acid and the immersion solution contains about 1 to 20 weight percent of the alkane sulfonic acid as a free acid.

11. A method as defined in claim 1, wherein the separated substrate from step (5) is rinsed at least once with water, polished with an abrasive powder, and then dried.

12. A method as defined in claim 1, wherein the etchant solution and the immersion solution, after one or more uses, are separately treated to recover at least a portion of the tin or tin/lead contained therein and to regenerate at least a portion of the etchant and immersion acids.

13. An integrated process for removing plating materials from a plated substrate comprising a copper-based alloy with a tin-based or tin/lead-based surface plated layer, said integrated process comprising:

(1) treating the plated substrate at a temperature of about 50° to 150° F. with an aqueous etchant solution consisting essentially of about 1 to 50 weight percent of an etchant acid and about 0.1 to 5 weight percent nitric acid, the surface plated layer metals being removed by, and dissolved in, the aqueous etchant solution and an intermetallic layer containing tin or tin/lead remaining on the treated surface;

(2) separating the treated substrate from the aqueous etchant solution and recovering the aqueous etchant solution;

(3) rinsing the separated substrate from step (2) with water;

(4) treating the rinsed substrate of step (3) at a temperature of about 70° to 210° F. with an aqueous immersion solution consisting essentially of about 1 to 50 weight percent of an immersion acid and about 1 to 150 g/l of copper cation in the form of a copper (II) salt, the tin or tin/lead in the intermetallic layer being removed from the substrate and the substrate being rendered essentially free of tin or tin/lead from the surface plated layer; and (5) separating the substrate from step (4) from the aqueous immersion solution and recovering the aqueous immersion solution, wherein the substrate is essentially free of surface plated tin or tin/lead;

wherein the recovered aqueous etchant solution of step (2) and the recovered aqueous immersion solution from step (5) are separately treated to recover at least a portion of the tin or tin/lead contained therein and to regenerate aqueous etchant solution or aqueous immersion solution; and wherein the etchant acid and the immersion acid are independently selected from the group consisting of sulfuric acid and alkane sulfonic acids.

14. An integrated process as defined in claim 13, wherein the etchant acid and the immersion acid are both the same alkane sulfonic acid.

15. An integrated process as defined in claim 14, wherein both the etchant acid and the immersion acid are methane sulfonic acid, the etchant solution contains about 15 to 25 weight percent methane sulfonic acid and about 1 to 1.5 weight percent nitric acid, and the immersion solution contains 20 to 30 weight percent of methane sulfonic acid and about 20 to 60 g/l of the copper cation.

16. An integrated process as defined in claim 13, wherein the immersion solution contains 20 to 30 weight percent of methane sulfonic acid and about 20 to 60 g/l of the copper cation.

17. A method as defined in claim 13, wherein the etchant acid and the immersion acid are both sulfuric acid.

18. An integrated process as defined in claim 17, wherein the etchant solution contains about 15 to 25 weight percent sulfuric acid and about 1 to 1.5 weight percent nitric acid and the immersion solution contains 20 to 30 weight percent of sulfuric acid and about 20 to 60 g/l of the copper cation.

19. An integrated process as defined in claim 13, wherein the immersion solution contains 20 to 30 weight percent of sulfuric acid and about 20 to 60 g/l of the copper cation.

20. An integrated process as defined in claim 13, wherein the copper cation in the immersion solution is derived from the addition of a water-soluble copper (II) salt.

21. An integrated process as defined in claim 13, wherein the copper cation in the immersion solution is derived from the electrolysis of a sulfonic acid solution using a soluble copper electrode.

22. An integrated process as defined in claim 13, wherein the immersion acid is alkane sulfonic acid and the immersion solution contains about 1 to 20 weight percent of the alkane sulfonic acid as a free acid.

23. An integrated process as defined in claim 13, wherein the separated substrate from step (5) is rinsed at least once with water, polished with an abrasive powder, and then dried.

24. An integrated process as defined in claim 13, wherein the recovered aqueous etchant solution is first treated in an electrolysis cell to plate out the tin contained therein and then in an ammonia recovery cell to remove ammonia from the recovered etchant solution and generate free etchant acid therein.

25. An integrated process as defined in claim 24, wherein at least a portion of the generated free etchant acid is used to prepare aqueous etchant solution.

26. An integrated process as defined in claim 25, wherein the etchant acid is alkane sulfonic acid and at least a portion of the generated free etchant acid is treated in an electrolysis cell using a copper anode to prepare aqueous immersion solution.

27. An integrated process as defined in claim 25, wherein the etchant acid is sulfuric acid and at least a portion of the generated free etchant acid is treated in an electrolysis cell using a copper anode to prepare aqueous immersion solution.

28. An integrated process as defined in claim 24, wherein the etchant acid is alkane sulfonic acid and at least a portion of the generated free etchant acid is treated in an electrolysis cell using a copper anode to prepare aqueous immersion solution.

29. An integrated process as defined in claim 24, wherein the etchant acid is sulfuric acid and at least a portion of the generated free etchant acid is treated in an electrolysis cell using a copper anode to prepare aqueous immersion solution.

* * * * *